United States Patent
Yoshioka et al.

(10) Patent No.: US 8,066,254 B2
(45) Date of Patent: Nov. 29, 2011

(54) MOLD FOR PRODUCING SILICA CRUCIBLE

(75) Inventors: Takuma Yoshioka, Akita (JP); Masaki Morikawa, Akita (JP)

(73) Assignee: Japan Super Quartz Corporation, Akita-shi (JP)

( * ) Notice: Subject to any disclaimer, the term of this patent is extended or adjusted under 35 U.S.C. 154(b) by 101 days.

(21) Appl. No.: 12/688,452

(22) Filed: Jan. 15, 2010

(65) Prior Publication Data

US 2010/0178374 A1    Jul. 15, 2010

(30) Foreign Application Priority Data

Jan. 15, 2009   (JP) .................................. 2009-006202

(51) Int. Cl.
*C03B 19/00* (2006.01)

(52) U.S. Cl. ............ 249/117; 65/144; 65/302; 249/137; 249/160

(58) Field of Classification Search ..................... 249/98, 249/117, 134, 137, 160; 65/144, 302
See application file for complete search history.

(56) References Cited

U.S. PATENT DOCUMENTS 3,155,479 A * 11/1964 Zimmerman ................. 249/137
7,160,387 B2 * 1/2007 Kishi et al. ..................... 65/17.3

FOREIGN PATENT DOCUMENTS

JP    2006-96616 A    4/2006

* cited by examiner

*Primary Examiner* — James Mackey
(74) *Attorney, Agent, or Firm* — Christensen O'Connor Johnson Kindness PLLC

(57) ABSTRACT

In a mold for use in the production of a silica crucible, a cylindrical rim member is engagedly supported through hooks to an inner side of an upper opening portion of the mold corresponding to an upper part of a silica crucible and an outer diameter of the rim member is smaller than an inner diameter of the mold but larger than an inner diameter of the silica crucible.

4 Claims, 4 Drawing Sheets

FIG. 5
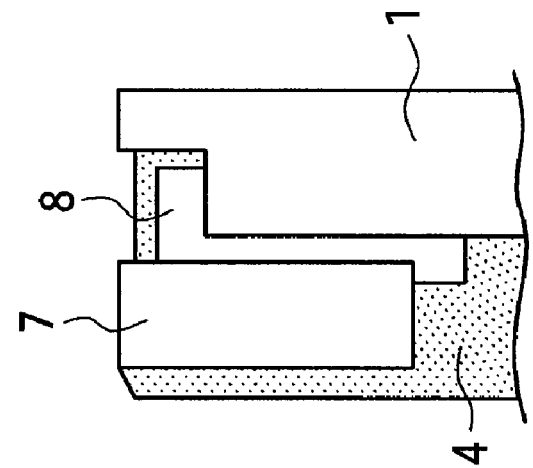
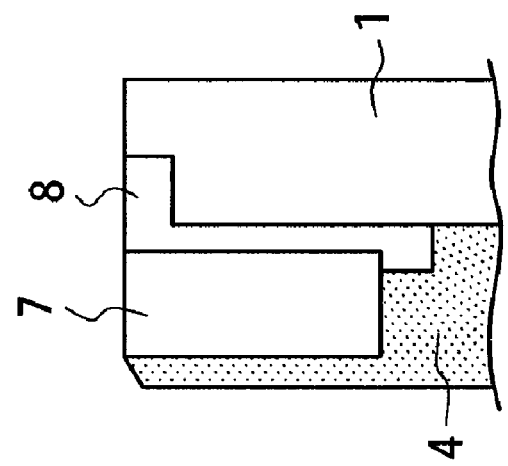
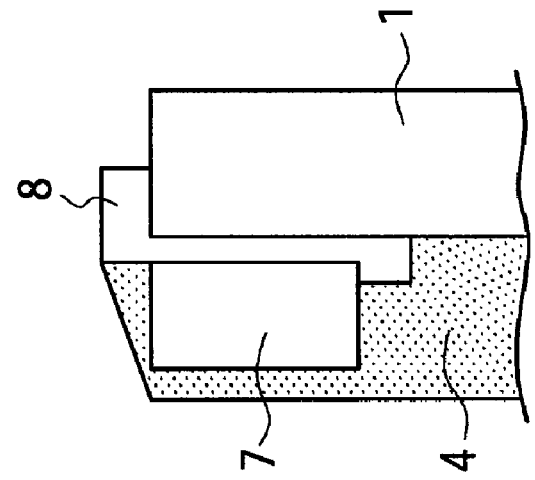

MOLD FOR PRODUCING SILICA CRUCIBLE

BACKGROUND OF THE INVENTION

1. Field of the Invention

This invention relates to a mold suitable for use in the production of a silica crucible used when producing a silicon single crystal ingot by a pulling method such as the CZ method or the like.

Particularly, the invention is directed to advantageously reduce the amount of silica or quartz powder used when producing a silica crucible by a rotating mold method.

2. Description of the Related Art

Recently, the use of a silicon wafer as a substrate for semiconductor devices has increased rapidly. Such a silicon wafer is usually produced by forming a silicon single crystal ingot and then slicing it.

Such a silicon single crystal ingot is generally produced, for example, by a pulling method such as the CZ method or the like. Also, a silica crucible is used for pulling the silicon single crystal.

A typical method of producing a silica crucible is known as the rotating mold method. The rotating mold method is a method wherein silica or quartz powder is attached to an inner wall of a rotating mold, that is, a bottom surface and a side surface of the mold and then fused by heating (e.g., by arc heating) to produce a silica crucible.

Recently, the silicon single crystal ingot is desired to have a larger diameter in association with the rapid increase in the demand for silicon wafers.

When such a large-diameter silicon single crystal ingot is produced by the pulling method, the silica crucible to be used is also required to have a larger diameter.

In order to produce the silicon single crystal ingot by the pulling method, it is usually required to use a silica crucible having a diameter corresponding to about three times the diameter of the ingot.

When the silica crucible is produced by the above-mentioned rotating mold method, a portion having a small outer diameter and a thin thickness (hereinafter referred to as a small-diameter thinned portion) occurs in an upper part of the silica crucible, and hence it is required to remove the small-diameter thinned portion by cutting.

When the silica crucible is heated to a high temperature in a step for filling and melting Si in the silica crucible to pull an Si single crystal, the viscosity of silica is reduced as the temperature rises and hence the silica crucible is easily deformed. Especially when the upper part of the silica crucible is the small-diameter thinned portion, it is apt to be fallen down inward and easily deformed.

A cause of forming such a small-diameter thinned portion is that heat easily escapes at the opening portion of the mold and the silica or quartz powder is not completely melted by arc heating, and hence the outer diameter at the upper part of the silica crucible becomes small and the thickness thereof becomes thin. The formation of such a small-diameter thinned portion is unavoidable in the production process.

As a technique for preventing the small-diameter thinned portion of the crucible from falling down inward, JP-A-2006-96616 proposes a silica glass crucible in which a ring-shaped member preferably made of carbon is embedded in the upper portion of the crucible. The development of such a silica glass crucible can reduce the falling of the small-diameter thinned portion of the crucible inward. However, the formation of the small-diameter thinned portion cannot be completely prevented. Therefore, it is still difficult to produce a good silicon single crystal ingot by the pulling method even when such a silica glass crucible is used.

Also, this technique entails such a structure that a ring-shaped member made of a different material is embedded in a crucible, so that there is a fear that when a carbon ring is embedded in a silica glass, strain is caused due to the difference in the thermal expansion coefficient between both the members.

Therefore, when the silica crucible is produced by the rotating mold method, by anticipating the formation of the small-diameter thinned portion is produced a silica crucible having a crucible height higher by the small-diameter thinned portion than a height of a product specification and then the small-diameter thinned portion is removed by cutting to obtain a product.

Also, silica crucibles having different heights may be produced in the same mold. Although there is no problem in the production of a silica crucible having a higher height, a portion to be removed by cutting becomes large in the production of a silica crucible having a low height. In order to solve the problem, a mold for exclusive use for a product having a low height may be provided, but when the number of silica crucibles produced is small or the like, there is a disadvantage that the production cost of a new mold and related costs become significant.

As described above, when the silica crucible is produced by the rotating mold method, the formation of the small-diameter thinned portion is unavoidable, so that a silica crucible having a crucible height higher by the small-diameter thinned portion than a height of a product specification is produced and then the small-diameter thinned portion is removed by cutting to obtain a product (silica crucible) through usual steps.

However, the silica crucible is recently required to have a large diameter with the increase of the diameter of the silicon single crystal ingot as described above. When the diameter of the crucible is made larger, a portion obliged to be removed by cutting is also increased due to the small-diameter thinning, which causes a serious problem in terms of the material cost, and hence the production cost.

For example, if it is intended to produce a crucible having an outer diameter of about 457 mm (18 inches) and a thickness of 8 mm, about 0.3 kg of silica or quartz powder as an absolute amount is used extra per cutting-removing height of 10 mm.

On the other hand, if it is intended to produce a large-size silica crucible having an outer diameter of about 813 mm (32 inches), the thickness increases to approximately 15 mm, and hence about 1.0 kg of silica or quartz powder as an absolute amount is used extra per cutting-removing height of 10 mm.

In the production of a large-size silica crucible, therefore, the wasted amount of silica or quartz powder used per cutting-removing height in the production of one crucible increases to three to four times that of producing a small-size silica crucible.

SUMMARY OF THE INVENTION

The invention is developed in the light of the above situation and is to provide a mold for producing a silica crucible capable of reducing a portion obliged to be removed by cutting due to the small-diameter thinning in the upper part of the silica crucible to effectively reduce the material cost.

That is, the summary and construction of the invention are as follows:

1. A mold for use in the production of a silica crucible having an upper opening portion, comprising: a cylindrical rim member; and one or more hooks, wherein the cylindrical rim member is engagedly supported through the one or more hooks to an inner side of the upper opening portion of the mold and, wherein an outer diameter of the rim member is smaller than an inner diameter of the mold but larger than an inner diameter of a silica crucible to be formed in the mold.

2. A mold for use in the production of a silica crucible according to item 1, wherein the rim member is a recycled small-diameter thinned portion formed in an upper portion of the silica crucible during the production of the silica crucible and then removed by cutting.

3. A mold for use in the production of a silica crucible according to item 1, wherein the one or more hooks are made of carbon or a composite of carbon and ceramics.

4. A mold for use in the production of a silica crucible according to item 1, wherein a protruding thickness $t_1$ of an inner surface of the cylindrical rim member from an inner peripheral wall of the mold, which is defined by $t_1$=(inner diameter of mold−inner diameter of rim member)/2, is 20 to 80% of a thickness $t_2$ of silica or quartz powder to be attached to the inner peripheral wall of the mold.

5. A mold for use in the production of a silica crucible according to item 1, wherein the mold is used in a rotating mold method.

According to the invention, it is possible to reduce a portion to be removed by cutting due to the small-diameter thinning as compared with the conventional technique, and as a result, the material cost and hence the product cost can be reduced.

Furthermore, according to the invention, it is possible to recycle as a rim member a small-diameter thinned portion inevitably formed in the upper portion of the silica crucible during the production of the silica crucible and then removed by cutting, so that extra cost is not required for the production of the rim member.

Moreover, the hooks as a hanging jig of the invention can be used repeatedly.

BRIEF DESCRIPTION OF THE DRAWING

The invention will be described concretely with reference to the accompanying drawings, wherein:

FIG. 5 is a diagram showing a preferable embodiment of engagedly supporting a rim member through a hook.

DESCRIPTION OF THE PREFERRED EMBODIMENTS

Figure 1:
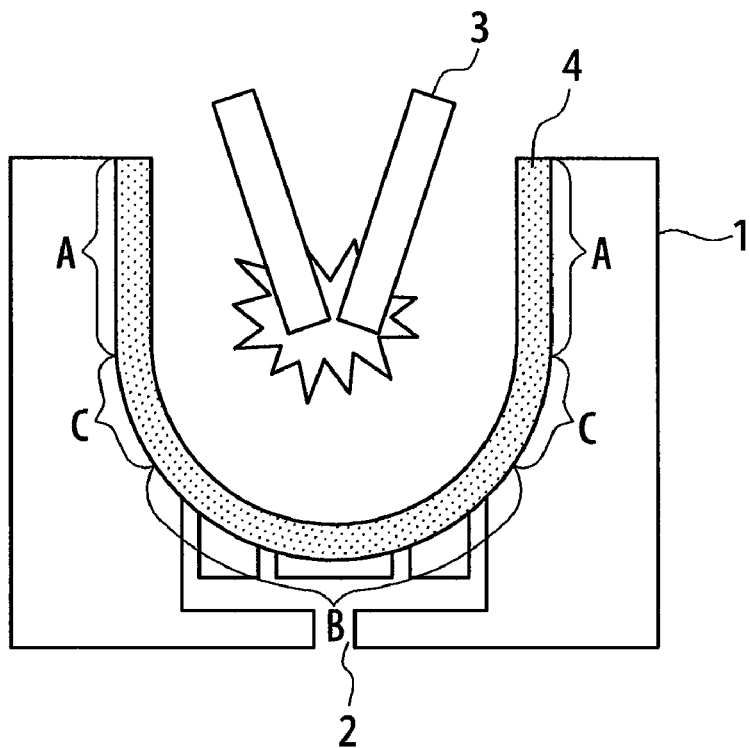
FIG. 1 is a cross-sectional view illustrating a production manner of a silica crucible by a rotating mold method.

In FIG. 1 is schematically shown a typical production manner of a silica crucible by a rotating mold method. In FIG. 1, numeral 1 is a mold, numeral 2 a vent pipe, numeral 3 arc electrodes, and numeral 4 silica or quartz powder attached onto an inner wall of the mold 1. Moreover, the mold 1 comprises a cylindrical straight body A, a cone-shaped bottom portion B and a corner portion C connecting them as shown in FIG. 1.

In the rotating mold method, the silica or quartz powder 4 attached onto the inner wall of the rotating mold 1 can be vitrified by fusing through arc heating and shaped into a crucible form.

Figure 2:
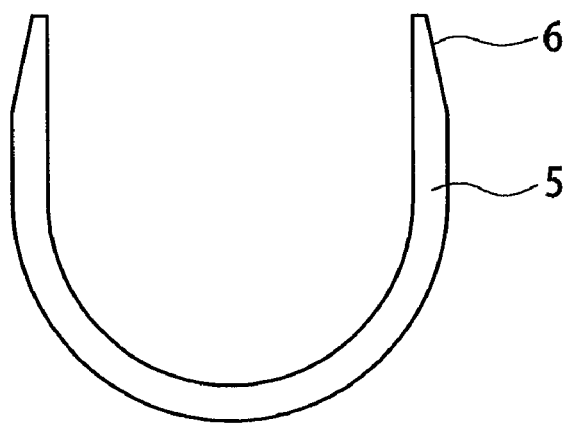
FIG. 2 is a schematically cross-sectional view of a silica crucible produced using a commonly-used mold.

In FIG. 2 is shown a cross-sectional shape of a vitreous silica crucible 5 produced by using a commonly-used conventional mold.

As shown in FIG. 2, the upper portion of the vitreous silica crucible 5 becomes smaller in the outer diameter and thinner in the thickness to form a small-diameter thinned portion 6.

Figure 3:
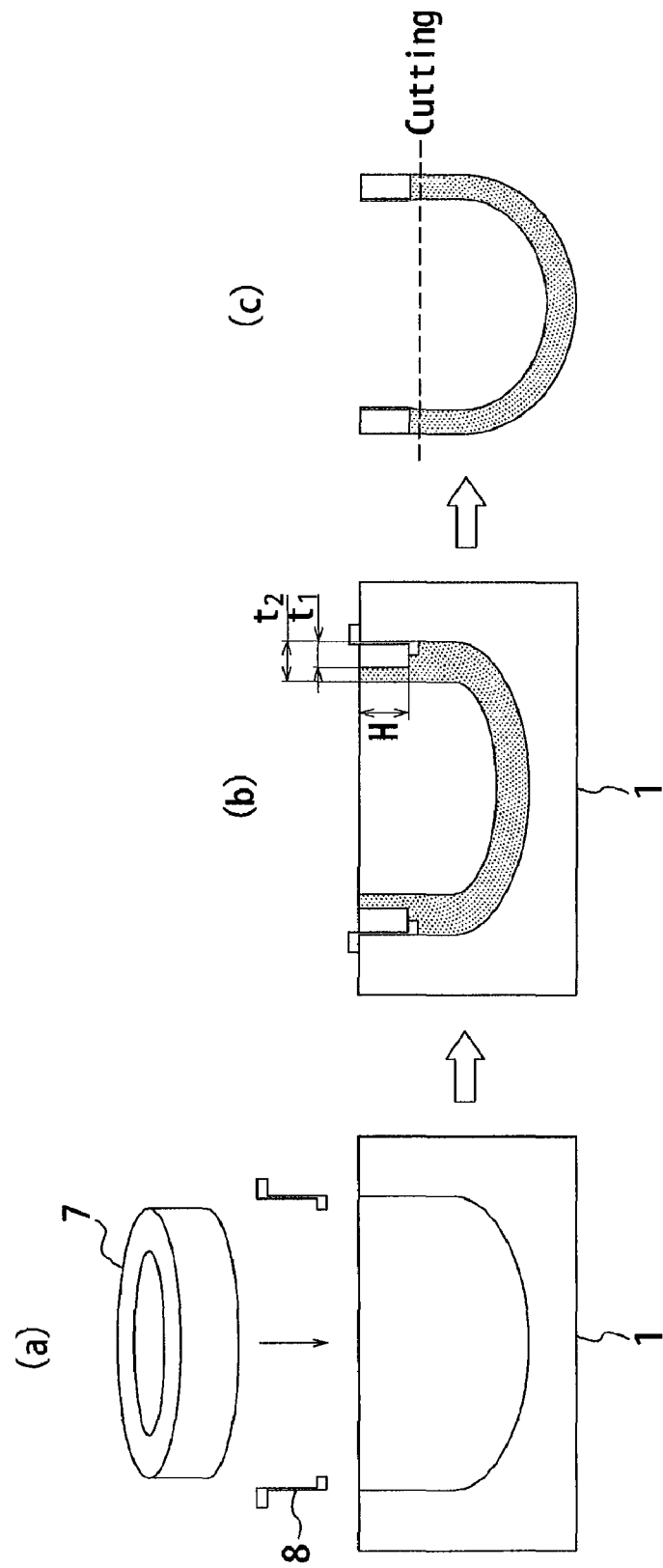
FIG. 3 is a schematic view of a mold according to the invention, wherein (*a*) is an exploded view of the mold, (*b*) is a diagram showing a state of combining a rim member and a mold substrate, and (*c*) is a diagram showing a cutting of a small-diameter thinned portion.

In the invention, as shown in FIG. 3, a cylindrical rim member is engagedly supported through hooks to the inner side of the upper opening portion of the mold so as to solve the above problem.

The invention is based on a technological idea that if an upper portion of a crucible becomes inevitably smaller in the outer diameter and thinner in the thickness in the production of the crucible, the mold for the crucible is preliminarily rendered into a shape corresponding to the shape of the upper portion of the crucible, whereby an amount of silica or quartz powder wastefully used can be reduced.

Also, the invention is based on a technological idea that it is possible to recycle as a rim member a small-diameter thinned portion formed in the upper portion of the silica crucible during the production of the silica crucible and obliged to discard after being removed by cutting, whereby extra production cost is unnecessary.

In FIG. 3, numeral 7 is a rim member and numeral 8 is a hook as a hanging jig for the rim member 7.

In the invention, the rim member 7 can be newly produced separately. However, it is advantageous in terms of cost to recycle as a rim member a small-diameter thinned portion formed in the upper portion of the silica crucible during the production of the silica crucible and obliged to discard after being removed by cutting.

When such a small-diameter thinned portion is recycled, it is advantageous not only to adjust a height of a cylindrical body to a desired height but also to conduct a grinding treatment so as to make a thickness of the cylindrical body uniform.

As another rim member can be used carbon having a barrier function against arc heating (thermal conductivity: about 140 W/mK, thermal expansion coefficient: about $5 \times 10^{-6}$/° C.).

In the invention, it is preferable that a protruding thickness $t_1$ of an inner surface of the rim member from an inner surface of the mold is 20 to 80% of a thickness $t_2$ of silica or quartz powder attached to the inner surface of the mold.

When a ratio of the protruding thickness $t_1$ to the attached thickness $t_2$ is less than 20%, the effect of reducing the silica or quartz powder used and hence the cost-saving effect is small, while when it exceeds 80%, there is a risk that a carbon rim member will be easily consumed by oxidation though there is no problem in the case of a silica or quartz rim member.

Moreover, a shrinkage percentage of silica or quartz powder is about 50 to 65%, and thus the thickness of the silica crucible is about 35 to 50% of the attached thickness of the silica or quartz powder. Therefore, when the protruding thickness $t_1$ of the inner surface of the rim member from the inner surface of the mold is 20 to 80% of the attached thickness $t_2$ of the silica or quartz powder, the inner diameter of the rim member may be larger than, nearly equal to or smaller than that of the silica crucible. Thus, in the invention, the inner diameter of the rim member is not particularly limited and there can be adapted a rim member having an inner diameter larger than, nearly equal to or smaller than that of the silica crucible.

Further, the height H of the rim member 7 may be equal to the height of the small-diameter thinned portion. For example, when a crucible having an outer diameter of about 813 mm (32 inches) and a thickness of 15 mm is produced, the height of the small-diameter thinned portion is about 30 to 100 mm.

The thickness of the rim member 7 is not particularly limited, but is preferable to be about 5 to 15 mm.

In the invention, it is further preferable that the inner surface of the rim member has a surface roughness of about 6.3 to 25 μm as an arithmetic mean roughness Ra.

When the roughness of the inner surface in the rim member is less than 6.3 μm as Ra, silica or quartz powder easily moves at the time of attachment or heat-fusion of the silica or quartz powder and hence the deterioration of the crucible accuracy is caused, while when it exceeds 25 μm, grains fall off from the surface of the rim member and become impurities of the silica crucible.

When the small-diameter thinned portion after being removed by cutting is recycled as the rim member, such a portion is melted and integrated to a zone newly forming a small-diameter thinned portion in the production of the crucible and hence such a zone is basically removed by cutting after the production of the crucible, but this zone can be recycled many times when it is judged to be endurable to a further use.

When carbon having a barrier function against arc heating is used as a rim member, the carbon rim member can be used repeatedly because it is hardly consumed in one or two use.

Figure 4:
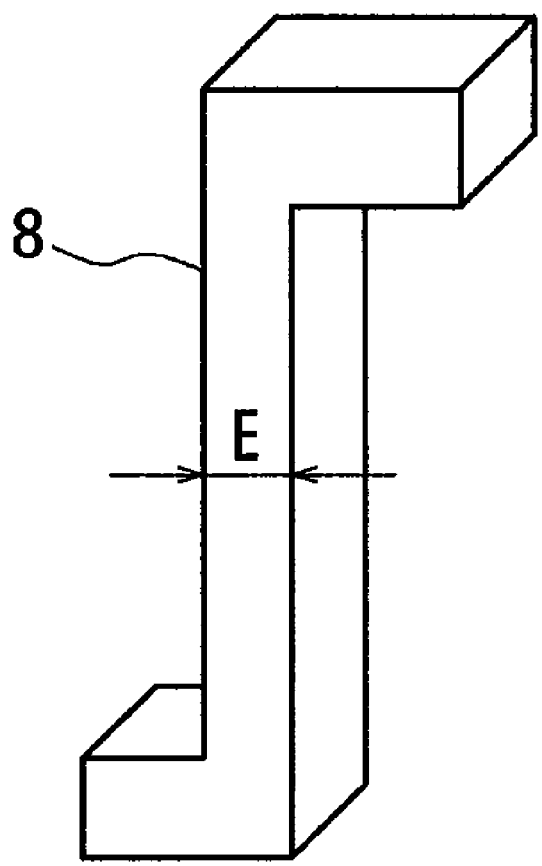
FIG. 4 is a diagram showing a typical shape of a hook.

Next, FIG. 4 shows a typical shape of the hook 8 as a hanging jig for the rim member. The shape of the hook 8 is not particularly limited and may be of any shape capable of stably supporting the rim member by hanging. However, since the hook needs to be disposed on an unmelted portion in the production of the crucible, that is, between an inner surface of the mold left at an unmelted state during the melting and an outer surface of the crucible, a thickness of a portion E in the hook is preferable to be less than that of the unmelted portion. For example, when a crucible having an outer diameter of about 813 mm (32 inches) and a thickness of 15 mm is produced, the thickness of the unmelted portion is usually about 3 to 15 mm, so that the thickness of the portion E is required to be equivalent to such a thickness of the unmelted portion.

Therefore, a material for the hook is preferable to have load bearing properties and heat resistance even when the hook is thin and to be durable to multiple uses, which is typically exemplified by carbon (thermal conductivity: about 140 W/mK, thermal expansion coefficient: about $5 \times 10^{-6}/°C$.).

Furthermore, it is preferable that two to five hooks are disposed at equal intervals from a viewpoint that the rim member is supported stably by hanging. More preferably, the number of hooks is 3 or 4.

Next, the preferable manner of engagedly supporting the rim member 7 by the hooks 8 will be described with reference to FIG. 5.

FIG. 5(a) shows a basic form, in which an upper end portion of the hook 8 is locked on an upper surface of the mold 1 and thereafter the rim member 7 is engaged with a lower end portion of the hook 8 and then silica or quartz powder is filled so as to embed the rim member 7 therein.

FIG. 5(b) shows a case of taking measures against the deterioration of the hook 8, in which a groove hanging the hook 8 (whose width and depth correspond with or larger than the hook shape) is provided on the upper surface of the mold 1 so that the upper surfaces of the mold 1, the hook 8 and the rim member 7 are so-called flush or the hook 8 is not projected from the upper surface of the mold 1.

FIG. 5(c) shows a case of taking further measures against the deterioration of the hook 8, in which a groove having a size deeper than the upper end portion of the hook 8 is provided on the upper surface of the mold 1 to cover the upper surface of the hook 8 with silica or quartz powder.

Since the carbon hook is easily consumed through oxidation by contacting with oxygen at a high temperature, it is advantageous to suppress the contact with oxygen by providing the groove on the mold or covering the hook with silica or quartz powder as mentioned above.

EXAMPLE 1

In the invention, it is possible to reduce the silica or quartz powder by an amount corresponding to the volume of the rim member. That is, the amount of silica or quartz powder reduced can be approximated by the following equation:

Amount of silica or quartz powder reduced ≈ (weight of rim member/specific gravity of rim member) x bulk specific gravity of silica or quartz powder Therefore, the amount of silica or quartz powder reduced can be calculated according to the weight of the rim member used as shown in Table. 1.

TABLE 1

| Weight of rim member (kg) | Specific gravity of rim member | Bulk specific gravity of silica or quartz powder | Amount of silica or quartz powder reduced (kg) |
| --- | --- | --- | --- |
| 10 | 2.2 | 1.23 | 5.6 |
| 8 | 2.2 | 1.23 | 4.5 |
| 6 | 2.2 | 1.23 | 3.4 |
| 4 | 2.2 | 1.23 | 2.2 |
| 2 | 2.2 | 1.23 | 1.1 |
| 1 | 2.2 | 1.23 | 0.6 |

In fact, when a 32 inch silica crucible having an outer diameter of 810 mm and a thickness of 15 mm is produced with a mold having a structure according to the invention as shown in FIG. 3, a rim member having a weight of 8.3 kg is disposed as shown in FIG. 5(a). As a result, 4.7 kg of silica or quartz powder can be reduced.

Also, in the production of an 18 inch silica crucible having an outer diameter of 457 mm and a thickness of 8 mm, a rim member having a weight of 0.9 kg is disposed as shown in FIG. 5(a). As a result, 0.5 kg of silica or quartz powder can be reduced.

What is claimed is:

1. A mold for use in the production of a silica crucible having an upper opening portion, comprising:
   a cylindrical rim member; and
   one or more hooks, wherein the cylindrical rim member is engagedly supported through the one or more hooks to an inner side of the upper opening portion of the mold, and wherein an outer diameter of the rim member is smaller than an inner diameter of the mold but larger than an inner diameter of a silica crucible to be formed in the mold.

2. A mold for use in the production of a silica crucible according to claim 1, wherein the one or more hooks are made of carbon or a composite of carbon and ceramics.

3. A mold for use in the production of a silica crucible according to claim 1, wherein a protruding thickness $t_1$ of an inner surface of the cylindrical rim member from an inner peripheral wall of the mold, which is defined by $t_1=$(inner diameter of mold−inner diameter of rim member)/2, is 20 to 80% of a thickness $t_2$ of silica or quartz powder to be attached to the inner peripheral wall of the mold.

4. A mold for use in the production of a silica crucible according to claim 1, wherein the mold is configured to be rotatable.

* * * * *